United States Patent
Lee et al.

(10) Patent No.: US 8,304,887 B2
(45) Date of Patent: Nov. 6, 2012

(54) MODULE PACKAGE WITH EMBEDDED SUBSTRATE AND LEADFRAME

(75) Inventors: Lee Han Meng @ Eugene Lee, Muar (MY); Kuan Yee Woo, Tampin (MY)

(73) Assignee: Texas Instruments Incorporated, Dallas, TX (US)

( * ) Notice: Subject to any disclaimer, the term of this patent is extended or adjusted under 35 U.S.C. 154(b) by 228 days.

(21) Appl. No.: 12/635,624

(22) Filed: Dec. 10, 2009

(65) Prior Publication Data

US 2011/0140262 A1 Jun. 16, 2011

(51) Int. Cl.
*H01L 23/52* (2006.01)

(52) U.S. Cl. .............. 257/692; 257/723; 257/E21.508; 257/676

(58) Field of Classification Search .............. 257/676, 257/692, 713, 723, E21.506, E23.031, E23.141, 257/E23.101

See application file for complete search history.

(56) References Cited

U.S. PATENT DOCUMENTS

| | | | |
|---|---|---|---|
| 5,266,834 A | 11/1993 | Nishi et al. | |
| 5,767,570 A * | 6/1998 | Rostoker | 257/668 |
| 2007/0096160 A1 | 5/2007 | Beroz et al. | |
| 2007/0164409 A1 | 7/2007 | Holland | |

FOREIGN PATENT DOCUMENTS

| | | |
|---|---|---|
| JP | 11-312770 | 11/1999 |
| JP | 2009-224550 | 10/2009 |

OTHER PUBLICATIONS

International Search Report dated Jun. 24, 2011 from International Application No. PCT/US2010/053974.
Written Opinion dated Jun. 24, 2011 from International Application No. PCT/US2010/053974.

* cited by examiner

*Primary Examiner* — Roy Potter
(74) *Attorney, Agent, or Firm* — Steven A. Shaw; W. James Brady; Frederick J. Telecky, Jr.

(57) ABSTRACT

An integrated circuit package is described that includes a substrate, a leadframe and one or more integrated circuits that are positioned between the substrate and the leadframe. Multiple electrical components may be attached to one or both sides of the substrate. The active face of the integrated circuit is electrically and physically connected to the substrate. The back side of the integrated circuit is mounted on a die attach pad of the leadframe. The leadframe includes multiple leads that are physically attached to and electrically coupled with the substrate. A molding material encapsulates portions of the substrate, the leadframe and the integrated circuit. Methods for forming such packages are also described.

13 Claims, 4 Drawing Sheets

US 8,304,887 B2

MODULE PACKAGE WITH EMBEDDED SUBSTRATE AND LEADFRAME

FIELD OF THE INVENTION

The present invention relates generally to integrated circuit packages. More particularly, a module design involving an embedded substrate and leadframe is described.

BACKGROUND OF THE INVENTION

There are a number of conventional processes for packaging integrated circuit (IC) dice. Some packaging techniques contemplate the creation of electronic modules that incorporate multiple electronic devices (e.g. integrated circuits, passive components such as inductors, capacitor, resisters or ferromagnetic materials, etc.) into a single package.

While existing arrangements and methods for packaging electronic modules work well, there are continuing efforts to develop improved packaging techniques that provide cost effective approaches for meeting the needs of a variety of different packaging applications.

SUMMARY OF THE INVENTION

In one aspect of the present invention, an integrated circuit package is described that includes a substrate, a leadframe and an integrated circuit that is sandwiched between the substrate and the leadframe. Various implementations involve attaching electrical components (e.g., inductors, resistors, capacitors, integrated circuits, field effect transistors, etc.) to one or both sides of the substrate. The active face of the integrated circuit is electrically and physically connected with the substrate. The back side of the integrated circuit is mounted on a die attach pad of the leadframe. Multiple leads of the leadframe are physically attached and electrically coupled with the substrate. A molding material encapsulates portions of the substrate, the leadframe and the integrated circuit.

In some embodiments, a metal clip is attached to the die attach pad and one or more of the electrical devices. Portions of the metal clip and/or the die attach pad may be left exposed on the exterior of the integrated circuit package to facilitate heat dissipation. Some implementations involve a leadframe having one or more ground leads that are physically and electrically coupled to both the substrate and the die attach pad of the leadframe.

In another embodiment of the present invention, an integrated circuit package is described that has a leadframe with a die attach pad and multiple leads, wherein the die attach pad is downset relative to the leads. An integrated circuit is mounted on the die attach pad and is also physically and electrically connected to a substrate. A molding material encapsulates portions of the substrate, the leadframe and the integrated circuit.

In another aspect of the present invention, a method of forming the aforementioned integrated circuit package is described. Some implementations involve attaching electrical components to one or both sides of a substrate panel and singulating the panel to form multiple populated substrates that are each suitable for use in a single integrated circuit package. In various embodiments, multiple substrates are attached with a leadframe panel, which is later encapsulated in molding material and singulated to form multiple integrated circuit packages.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of electronic modules that include one or more integrated circuits and other electronic components. As will be appreciated by those familiar with the art, a common challenge for module package design is finding a balance between package size, internal device density and heat dissipation. The assignee of the present application, National Semiconductor Corporation, has developed various module designs that address such issues, including some described in application Ser. No. 12/390,349, entitled "Integrated Circuit Micro-Module," filed Feb. 20, 2009, and its related applications.

The present invention relates to an integrated circuit package with an embedded leadframe and substrate. At least one and possibly many electronic devices (e.g., integrated circuits, field effect transistors, inductors, capacitors, resistors, etc.) are mounted on one or both sides of the substrate. In various embodiments, multiple electronic devices are densely arranged on the substrate and electrically connected through traces on the substrate. Optionally, a metal clip can be attached to the substrate and at least some of the electronic devices. Portions of the metal clip and/or the leadframe may be left exposed on the exterior of the package to help dissipate heat from electronic devices within the package.

Figure 1:
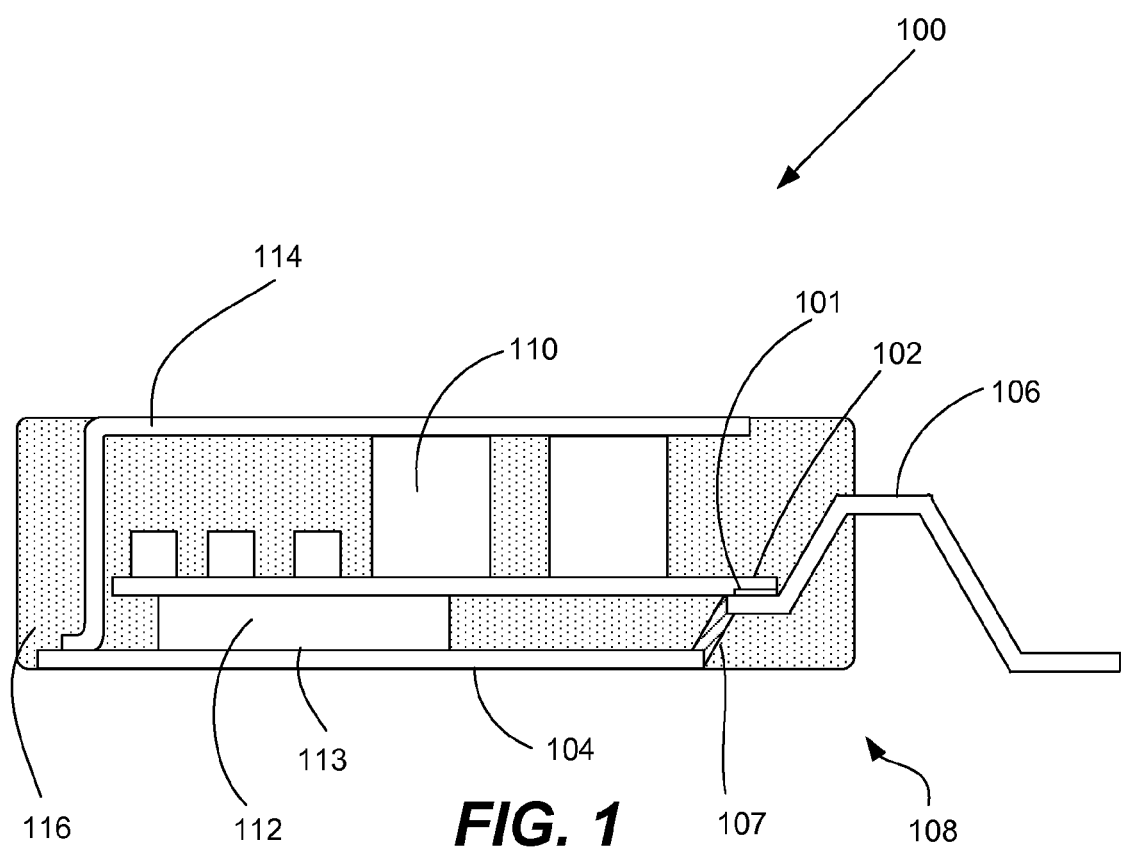
FIG. 1 is a diagrammatic side view of an integrated circuit module according to one embodiment of the present invention.

Referring next to FIG. 1, an integrated circuit package 100 according to one embodiment of the present invention will be described. The integrated circuit package 100 includes a substrate 102 and a leadframe 108 that sandwiches an integrated circuit 112. In the illustrated embodiment, one or more electrical components (e.g., capacitors, resistors, inductors, integrated circuits, etc.) are mounted on a top surface of the substrate 102. The integrated circuit 112 is mounted on a die attach pad 104 of the leadframe 108, which is downset relative to the leads 106. The leads 106 of the leadframe 108 are arranged to electrically connect with the substrate 102 via contact pads 101. In the illustrated embodiment, some of the leads are ground leads 107 that are electrically coupled to both the substrate 102 and the die attach pad 104. A metal clip 114 is attached to the die attach pad 104 and the top surfaces of some of the electrical components 110. A molding material 116 encapsulates portions of the leadframe 108, the substrate 102, the integrated circuit 112 and the electrical components 110.

Generally, the integrated circuit package 100 is arranged to support multiple, embedded electronic devices and to effectively dissipate heat generated by the devices. More particularly, multiple electrical components are mounted on both sides of the substrate 102. In various implementations, the electrical components on the top surface of the substrate 102 are passive components (e.g., inductors, capacitors, resisters, etc.) and/or the electrical components on the opposing bottom surface of the substrate 102 are integrated circuits, although this is not a requirement. Signals are routed between the attached electrical components through the substrate 102. Additionally, the metal clip 114 and/or the die attach pad 104 are exposed on the exterior of the integrated circuit package 110 and thus help dissipate heat generated by the integrated circuit 113 and the electrical components 110. The metal clip 114 also helps shield the internal electrical components from electromagnetic interference.

Figure 2:
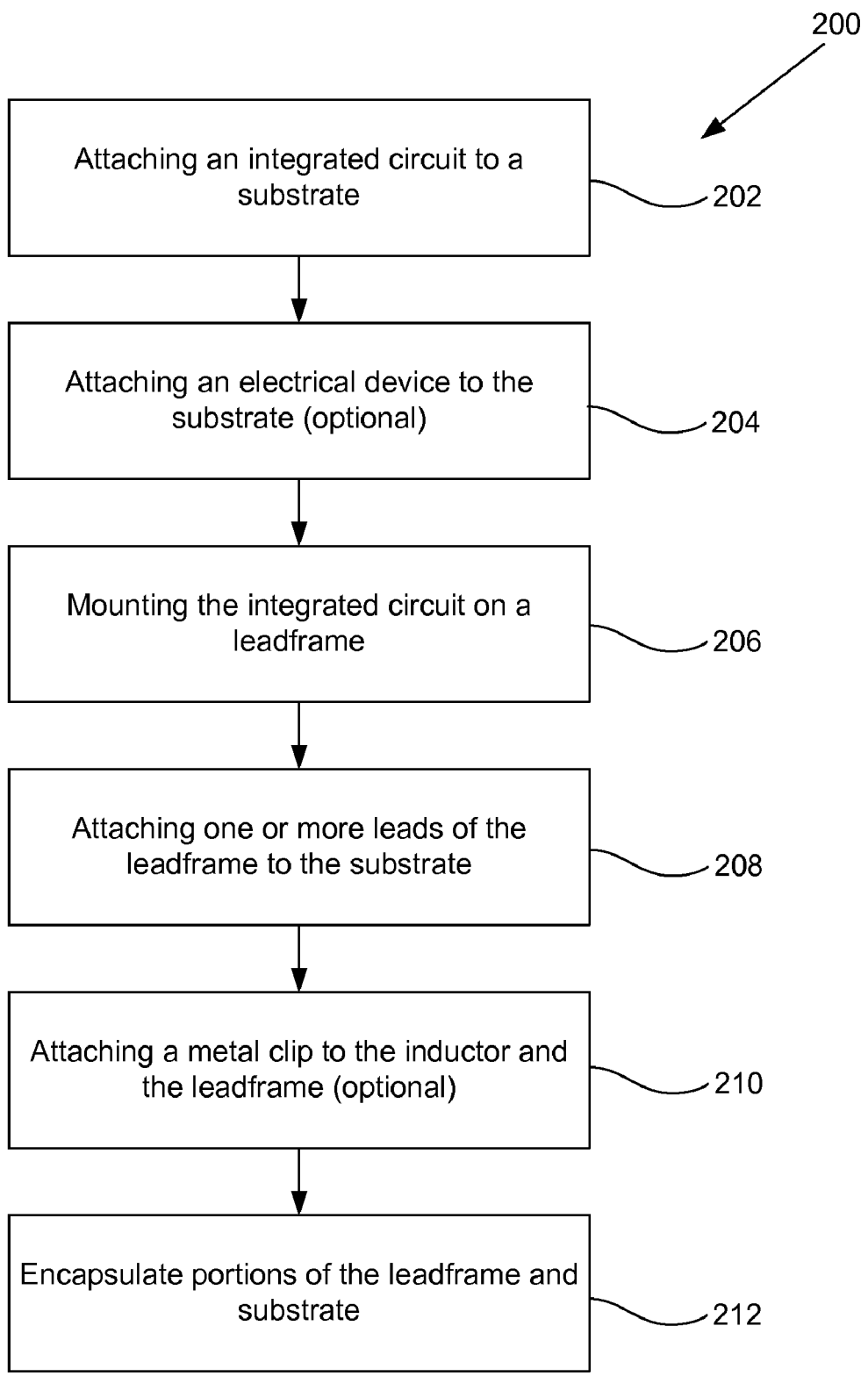
FIG. 2 is a flow chart that describes a method for fabricating an integrated circuit module according to one embodiment of the present invention.
Figure 3A:
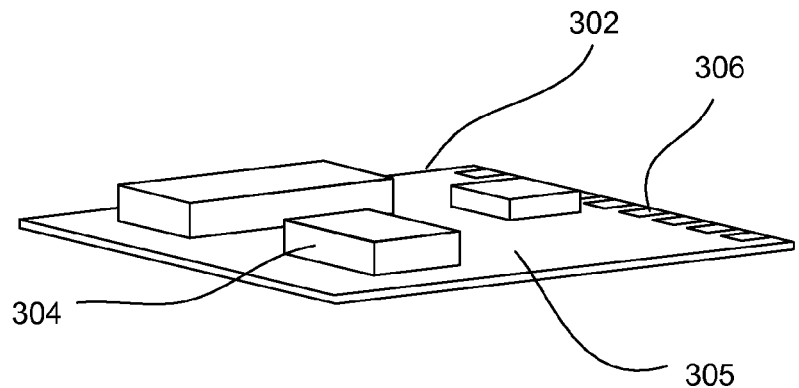
FIG. 3A is a perspective view of a substrate after multiple integrated circuits have been mounted on the substrate according to one embodiment of the present invention.

Referring next to FIG. 2, a method 200 for forming the integrated circuit package 100 illustrated in FIG. 1 will be described. Initially, as illustrated in FIG. 3A, integrated circuits 304 are attached to a substrate 302 (step 202 of FIG. 2). Typically, the integrated circuits 304 are attached in flip chip arrangement, although any suitable method known in the art may used to electrically connect one or more integrated circuits 304 to the substrate 302 (e.g., wire bonding, etc.) Although only a few integrated circuits 304 are shown, fewer or many more electrical components can be bonded to one and/or both sides of the substrate 302.

The substrate 302 can be arranged in any suitable manner that allows for the routing of electrical signals between components bonded with the substrate 302. By way of example, the substrate 302 may be a laminated electronic board including an inner interconnect layer made of one or more conductive traces and vias and an outer layer made of a suitable dielectric material 305 (e.g., solder mask). Exposed portions of the interconnect form component bonding sites (not shown) and lead contact pads 306 on the exterior surface(s) of the substrate 302. In the illustrated embodiment, the active surfaces of the integrated circuits 304 are mounted on the underlying component bonding sites and are electrically coupled with the lead contact pads 306 via the interconnect layer of the substrate 302.

Figure 3B:
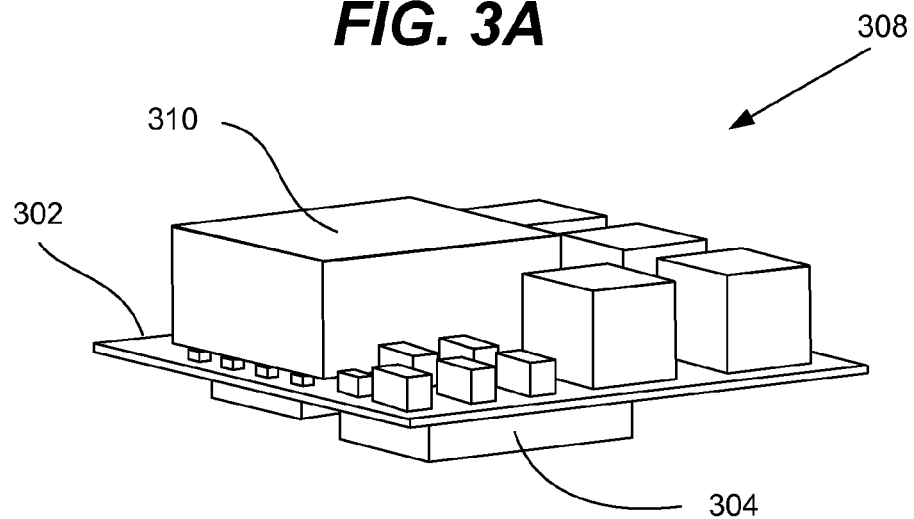
FIG. 3B is a diagrammatic perspective view of the substrate of FIG. 3A after multiple electrical components have been mounted on the substrate.

After attaching the integrated circuits to one side of the substrate 302 (step 202 of FIG. 2), one or more electrical components may be attached to the other side of the substrate 302 (step 204) to form the populated substrate component 308 of FIG. 3B. (It should be noted that step 204 is optional and can be performed before, after or generally at the same time as step 202.) In the illustrated embodiment, the electrical components 310 are passive components (e.g., inductors, resistors, capacitors, etc.), although in other implementations the electronic components 310 may include other types of devices (e.g., integrated circuits.) Each of the electrical components 310 is mounted on a respective component bonding site on the substrate 302, which is in turn electrically coupled with the integrated circuits 304 via the interconnect layer of the substrate 302.

The attaching of electrical devices (step 202 of FIG. 2) can be performed on a smaller substrate 302 suitable for use in forming a single integrated circuit package, or a larger substrate panel. In the latter case, multiple electrical components (e.g., integrated circuits, passive components, etc.) are electrically and physically attached to one or both sides of the substrate panel. Afterwards, the substrate panel is singulated to form multiple populated substrate components 308 of FIG. 3B.

Figure 3C:
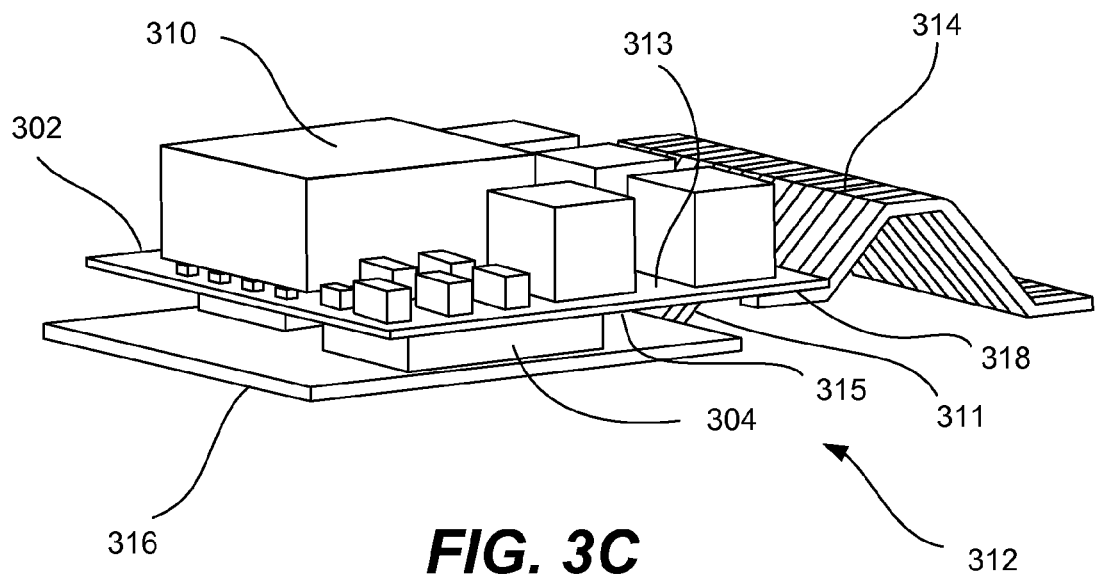
FIG. 3C is a diagrammatic perspective view of the substrate of FIG. 3B after a leadframe has been attached with the substrate.

The populated substrate component 308 is then connected with a leadframe 312, as shown in FIG. 3C. Generally, the leadframe 312 and the leads 314 of the leadframe 312 physically support the populated substrate component 308 and electrically connect it with external electrical devices. In the illustrated embodiment, the back sides of the integrated circuits 304 are mounted on the die attach pad 316, which is recessed or downset relative to the leads 314. The leads 314 each include an attachment surface 318 that is electrically and physically attached to a lead contact pad 306 on the substrate 302. As discussed earlier, the lead contact pads 306 are electrically coupled with the interconnect layer of the substrate 302 and provide electrical access to the various components that are mounted on the substrate 302.

In some implementations, one or more of the leads 314 are ground leads 311. In the embodiment illustrated in FIG. 3C, each ground lead 311 has a multi-tiered structure and connects to the downset die attach pad 316. The electrical and physical connection between the ground lead 311 and the die attach pad 316 may be formed in any appropriate manner. By way of example, the ground lead 311 may be integral to and continuous with the die attach pad 316. The ground lead 311 may also be separate from and attached to the die attach pad 316 using a suitable connecting structure (e.g., a solder joint, an electrically conductive adhesive, etc.) In the illustrated embodiment, the back side of each integrated circuit 304 includes a ground pad (not shown) that electrically connects the integrated circuit 304 with the die attach pad 316, although this is not a requirement. As a result, a common ground connection is accessible to the integrated circuits 304 and the ground leads 311.

In various implementations, the ground lead 311 includes an attachment surface 318 that is electrically connected to the substrate 302. In the illustrated embodiment, the attachment surface 318 is elevated relative to the die attach pad 316 and is substantially parallel to the die attach pad 316 and the substrate 302. As a result, the attachment surface 316 comes into electrical and physical contact with the lead contact pads 306 situated at the edge of the substrate 302. It should be appreciated that the electrical connection between the substrate 302 and the ground lead 311 can be arranged in various other ways as well. By way of example, the ground lead 311 may be electrically connected to the substrate 302 via an edge surface or the top surface 313 of the substrate 302 rather than through the bottom surface 315 of the substrate 302.

Figure 3D:
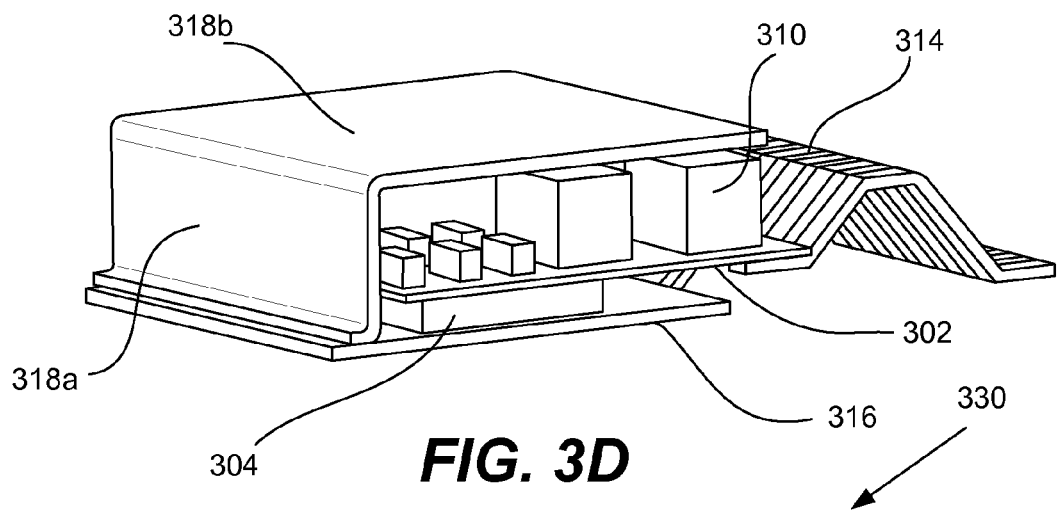
FIG. 3D is a diagrammatic perspective view of the substrate of FIG. 3C after a metal clip has been added.

After the attaching of the integrated circuits 304 and the substrate 302 to the leadframe 312, a thermally conductive metal clip 318 may optionally be added, as shown in FIG. 3D. Generally, the metal clip 318 is arranged to help dissipate heat from the interior of the package. In the illustrated embodiment, the metal clip 318 is physically and thermally coupled with the die attach pad 316 and some of the electrical components 310 mounted on the substrate 302. Heat generated by the integrated circuits 304 and the electrical components 310 can be transferred outside of the integrated circuit package through the metal clip 318.

The metal clip 318 may be arranged in a wide variety of ways, depending on the needs of a particular application. By way of example, the metal clip 318 in FIG. 3D has a L-shaped section that includes two connected, substantially perpendicular surfaces. One surface 318a, which is attached to the substrate 302, extends perpendicular to the die attach pad 316. The other surface 318b extends substantially parallel to and overlies the die attach pad 316, the substrate 302 and the active surfaces of the integrated circuits 304. A subset of the electrical components 310 extends high enough from the underlying substrate 302 to be thermally and physically coupled with the metal clip 318. This L-shaped configuration helps the metal clip 318 be an effective thermal conduit for both the integrated circuits 314 and the attached subset of electrical components 310. The metal clip 318 can also help shield covered electrical components from electromagnetic interference. In various implementations, the metal clip 318 may be arranged to enclose the substrate 302 to a greater extent e.g., the metal clip 318, together with the die attach pad 316, may form an open ended box around the substrate 302, the electrical components 310 and the integrated circuits 304. Some embodiments involve electrically grounding the metal clip 318 by electrically coupling it with a ground die attach pad 316 and/or ground leads 311.

Figure 3E:
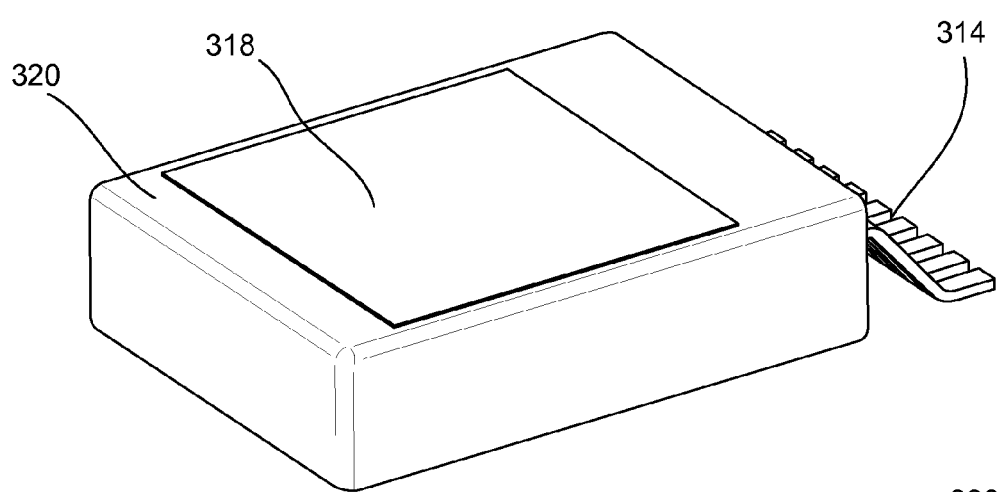
FIG. 3E is a diagrammatic perspective view of the substrate of FIG. 3D after encapsulation.
Figure 3F:
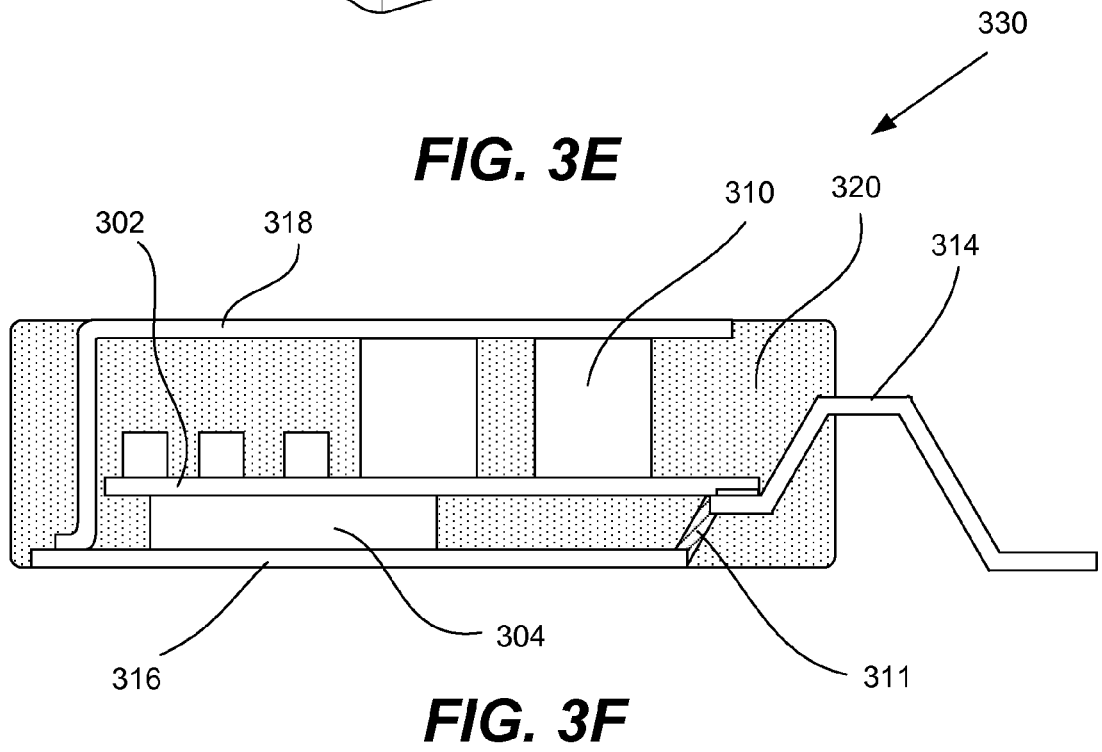
FIG. 3F is a diagrammatic cross-sectional view of the integrated circuit package of FIG. 3E.

Referring next to step 212 of FIG. 2 and FIG. 3E, portions of the substrate 302, the leadframe 312, the integrated circuits 304 and the electrical components 310 are encapsulated in a molding material 320. Preferably, the encapsulation is performed in a manner that leaves portions of the die attach pad 316 and/or the metal clip 318 exposed in order to dissipate additional heat from the interior of the package, as shown in FIG. 3F, which is a diagrammatic side view of the integrated circuit package 330 of FIG. 3E.

It should be appreciated that some or all of the above operations can be performed on the level of a leadframe panel. More specifically, prior to step 206 of FIG. 2, a leadframe panel with an array of device areas can be provided. Each device area of the leadframe panel includes multiple leads and a downset die attach pad similar to those shown in FIG. 3C. The arrangement of the leadframe panel may have been formed using any appropriate technique known in the art. For example, the aforementioned leadframe panel features and/or the downsetting of the die attach pad of each device area relative to the leads of the device area may have been formed by stamping a metal sheet. Multiple populated substrates 308 of FIG. 3B and/or metal clips 318 of FIG. 3D can be attached to each device area, as described in steps 206 and 208 of FIG. 2. Portions of the leadframe panel may then be encapsulated in molding material and singulated to form multiple integrated circuit packages 330 of FIGS. 3E and 3F.

Although only a few embodiments of the invention have been described in detail, it should be appreciated that the invention may be implemented in many other forms without departing from the spirit or scope of the invention. By way of example, FIG. 3E depicts leads that are in a gull-wing configuration and that extend out of only one side of the integrated circuit package 330. The present invention also contemplates leads that do not extend at all out of the package or that extend out of almost any number of surfaces of the package (e.g., a leadless leadframe package, a dual inline package, a quad inline package, etc.). Additionally, each method step illustrated in FIG. 2 may be reordered, modified and/or eliminated as appropriate for particular applications. Referring now to FIG. 3A, the integrated circuits 304 and the lead contact pads 306 are illustrated as being on the same surface of the substrate 302. The lead contact pads 306 are positioned at the edges of the substrate 304. As noted above, this arrangement works well for various applications, but other arrangements are also contemplated by the present invention (e.g., the lead contact pads 306 and/or the integrated circuits 304 may be positioned on any side of the substrate 304, etc.) Therefore, the present embodiments should be considered as illustrative and not restrictive and the invention is not limited to the details given herein, but may be modified within the scope and equivalents of the appended claims.

What is claimed is:

1. An integrated circuit package comprising:
   a substrate having a bottom surface and an opposing top surface, the substrate including a dielectric material and an interconnect layer that is embedded in the dielectric material;
   a leadframe that underlies the substrate and that includes a die attach pad and a plurality of leads that are physically attached to and electrically coupled with the substrate wherein a first lead of the plurality of leads, which is directly connected to the die attach pad, extends upward from the die attach pad to come in electrical and physical contact with the overlying substrate and extends further beyond the substrate such that the first lead is exposed on the exterior of the integrated circuit package, the first lead being arranged to electrically and physically couple the integrated circuit package with an external device;
   an integrated circuit having an active surface and an opposing back surface, the integrated circuit sandwiched between the substrate and the leadframe, the active surface of the integrated circuit physically and electrically connected with the bottom surface of the substrate, the back surface of the integrated circuit mounted on the die attach pad of the leadframe;
   a molding material that encapsulates at least portions of the substrate, the leadframe and the integrated circuit; and
   an electrical component mounted on the top surface of the substrate, the electrical component being electrically coupled with the integrated circuit through the interconnect layer in the substrate.

2. The integrated circuit package of claim 1 wherein the integrated circuit package includes:
   a plurality of passive electrical components that are mounted on and electrically coupled with the top surface of the substrate, the plurality of passive electrical components including at least one selected from a group consisting of: a resistor, a capacitor and an inductor; and
   a plurality of integrated circuits that are mounted on and electrically coupled with the bottom surface of the substrate, at least one of the plurality of integrated circuits being a field effect transistor.

3. The integrated circuit package of claim 1 wherein a portion of the die attach pad is exposed on an exterior surface of the integrated circuit package.

4. The integrated circuit package of claim 1 further comprising a metal clip that is attached to and electrically coupled with the electrical component and the die attach pad, a portion of the metal clip being exposed on an exterior surface of the integrated circuit package, the metal clip forming a heat spreader arranged to dissipate heat from the electrical component and the integrated circuit.

5. The integrated circuit package of claim 4 wherein:
   the metal clip is substantially L-shaped and includes connected first and second surfaces;
   the first surface of the metal clip is arranged substantially perpendicular to the substrate;
   the second surface of the metal clip is arranged substantially parallel to and overlies the top surface of the substrate and the active surface of the integrated circuit; and
   the metal clip entirely overlies the die attach pad and the active surface of the integrated circuit, the metal clip being arranged to help shield the integrated circuit from electromagnetic interference.

6. The integrated circuit package of claim 1 wherein at least one of the leads is a ground lead that is attached to and electrically coupled with both the die attach pad and the substrate.

7. The integrated circuit package of claim 6 wherein:
   each lead of the ground leads includes an attachment surface that is physically and electrically coupled to the substrate, and is integrally connected to the die attach pad;
   the die attach pad is downset from and arranged substantially parallel to the attachment surfaces of the leads; and
   the attachment surface is attached to and electrically coupled with the bottom surface of the substrate.

8. The integrated circuit package of claim 1 wherein the plurality of leads extend out from only one side of the integrated circuit package and are arranged in a gull-wing configuration.

9. The integrated circuit package of claim 5 wherein the integrated circuit package includes a plurality of electrical components that are mounted on the top surface of the substrate and that have different heights, at least one of the plurality of electrical components having a height that is greater than the height of the other ones of the plurality of electrical components, the at least one of the electrical components being directly thermally and physically connected to the overlying second surface of the metal clip, wherein the other ones of the plurality of electrical components are not directly connected to the metal clip.

10. An integrated circuit package comprising:
    a substrate including a dielectric material and an interconnect layer that is embedded in the dielectric material, the substrate including a top surface and an opposing bottom surface;
    a leadframe including a die attach pad and a plurality of leads, each lead including an attachment surface, the die attach pad being downset relative to the attachment surfaces of the plurality of leads, a first lead of the plurality of leads being directly physically and electrically connected to the die attach pad, at least some of the plurality of leads being attached to and electrically coupled with the substrate at their respective attachment surfaces;
    an integrated circuit including an active surface and an opposing back surface, the active surface being physically connected and electrically coupled with the bottom surface of the substrate, the back surface of the integrated circuit being mounted on the die attach pad of the leadframe, the integrated circuit having a ground pad that is mounted on the die attach pad of the leadframe, the integrated circuit being electrically and physically connected to the substrate wherein the first lead, the ground pad on the integrated circuit and the die attach pad are arranged to be electrically grounded and electrically coupled with one another;
    a molding material that encapsulates portions of the substrate, the leadframe and the integrated circuit; and
    an electrical component that is mounted on the top surface of the substrate and is electrically coupled with the integrated circuit via an interconnect layer in the substrate.

11. The integrated circuit package of claim 10 further comprising a metal clip that is attached to and electrically coupled with the electrical component and the die attach pad, a portion of the metal clip being exposed through the molding material, the metal clip forming a heat spreader that helps dissipate heat from the integrated circuit and the electrical component.

12. The integrated circuit package of claim 11 wherein the metal clip includes a substantially L-shaped section having connected first and second surfaces, the first surface arranged substantially perpendicular to the substrate, the second surface arranged parallel to the substrate and the active surface of the integrated circuit, the metal clip entirely overlying the die attach pad and the active surface of the integrated circuit, the metal clip arranged to help shield the integrated circuit from electromagnetic interference.

13. The integrated circuit package of claim 10 wherein at least one of the leads is a ground lead that is attached to and electrically coupled with the die attach pad and the substrate.

* * * * *